(12) United States Patent
Beach

(10) Patent No.: US 8,546,206 B2
(45) Date of Patent: Oct. 1, 2013

(54) ENHANCEMENT MODE III-NITRIDE FET

(75) Inventor: Robert Beach, Altadena, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 13/188,299

(22) Filed: Jul. 21, 2011

(65) Prior Publication Data

US 2011/0275183 A1 Nov. 10, 2011

Related U.S. Application Data

(60) Continuation of application No. 12/116,366, filed on May 7, 2008, and a division of application No. 11/040,657, filed on Jan. 21, 2005, now Pat. No. 7,382,001.

(60) Provisional application No. 60/538,795, filed on Jan. 23, 2004.

(51) Int. Cl.
    *H01L 21/338* (2006.01)
(52) U.S. Cl.
    USPC ............ 438/172; 438/285; 438/312; 438/483

(58) Field of Classification Search
    USPC .......... 438/172, 285, 312, 483; 257/E21.403
    See application file for complete search history.

(56) References Cited

U.S. PATENT DOCUMENTS 6,248,666 B1 * 6/2001 Frijlink et al. ............... 438/689

\* cited by examiner

*Primary Examiner* — Jack Chen
(74) *Attorney, Agent, or Firm* — Farjami & Farjami LLP

(57) ABSTRACT

A III-nitride switch includes a recessed gate contact to produce a nominally off, or an enhancement mode, device. By providing a recessed gate contact, a conduction channel formed at the interface of two III-nitride materials is interrupted when the gate electrode is inactive to prevent current flow in the device. The gate electrode can be a schottky contact or an insulated metal contact. Two gate electrodes can be provided to form a bi-directional switch with nominally off characteristics. The recesses formed with the gate electrode can have sloped sides. The gate electrodes can be formed in a number of geometries in conjunction with current carrying electrodes of the device.

13 Claims, 6 Drawing Sheets

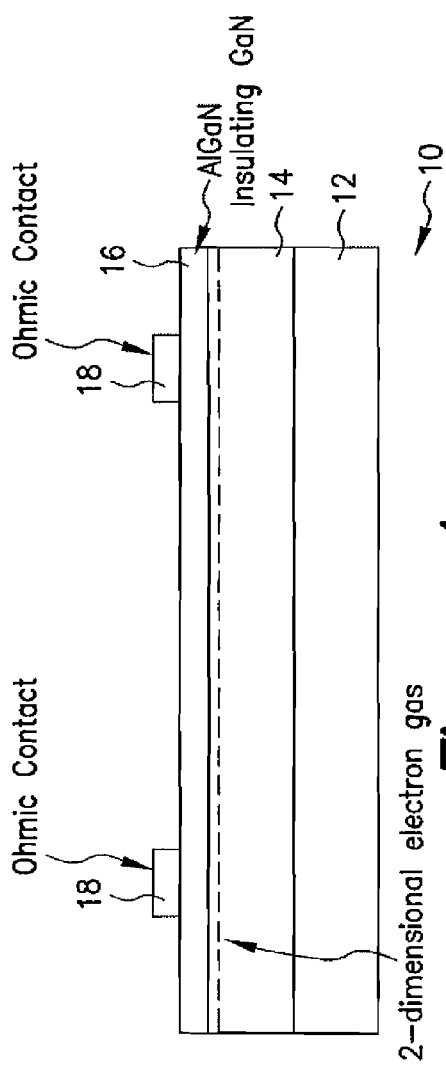
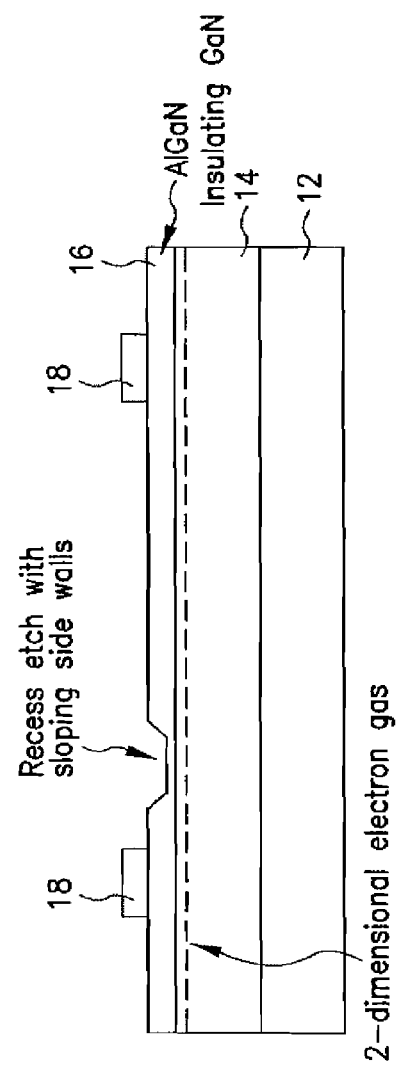

ENHANCEMENT MODE III-NITRIDE FET

CROSS-REFERENCE TO RELATED APPLICATION

This is a continuation of application Ser. No. 12/116,366 filed May 7, 2008. The present application is a division of U.S. application Ser. No. 11/040,657, filed Jan. 21, 2005 now U.S. Pat. No. 7,382,001, entitled "ENHANCEMENT MODE III-NITRIDE FET," which is based on and claims priority to U.S. Provisional Application No. 60/538,795, filed Jan. 23, 2004, entitled "ENHANCEMENT MODE FET BASED ON ETCHED GATE," the contents of which are herein incorporated by reference.

BACKGROUND OF THE INVENTION

1. Field of the Invention

The present invention relates generally to a class of field effect transistors based on III-nitride materials, and relates more particularly to an enhancement mode.

2. Description of Related Art

III-nitride semiconductors are presently known that exhibit a large dielectric breakdown field of greater than 2.2 MV/cm. III-nitride heterojunction structures are also capable of carrying extremely high currents, which makes devices fabricated in the III-nitride material system excellent for power applications.

Development of devices based on HI-nitride materials has generally been aimed at high power-high frequency applications such as emitters for cell phone base stations. The devices fabricated for these types of applications are based on general device structures that exhibit high electron mobility and are referred to variously as heterojunction field effect transistors (HFETs), high electron mobility transistors (HEMTs) or modulation doped field effect transistors (MODFETs). These types of devices are typically able to withstand high voltages such as in the range of 100 Volts, while operating at high frequencies, typically in the range of 2-100 GHz. These types of devices may be modified for a number of types of applications, but typically operate through the use of piezoelectric polarization fields to generate a two dimensional electron gas (2DEG) that allows transport of very high current densities with very low resistive losses. The 2DEG is formed at an interface of AlGaN and GaN materials in these conventional III-nitride HEMT devices. Due to the nature of the AlGaN/GaN interface, and the formation of the 2DEG at the interface, devices that are formed in the III-nitride materials system tend to be nominally on, or depletion mode devices. The high electron mobility of the 2DEG at the interface of the AlGaN/GaN layers permits the III-nitride device, such as a HEMT device, to conduct without the application of a gate potential. The nominally on nature of the HEMT devices previously fabricated have limited their applicability to power management. The limitations of nominally on power devices is observed in the need to have a control circuit be powered and operational, before power can be safely controlled by a III-nitride HEMT device. Accordingly, it would be desirable to create a III-nitride HEMT device that is nominally off to avoid current conduction problems during start-up and other modes.

A drawback of III-nitride HEMT devices that permit high current densities with low resistive losses is the limited thickness that can be achieved in the strained AlGaN/GaN system. The difference in the lattice structures of these types of materials produces a strain that can result in dislocation of films grown to produce the different layers. This results in high levels of leakage through a barrier layer, for example. Some previous designs have focused on reducing the in-plane lattice constant of the AlGaN layer to near where the point of relaxation occurs to reduce the dislocation generation and leakage. However, the problem of limited thickness is not addressed by these designs.

Another solution is to add insulation layers to prevent leakage problems. The addition of an insulator layer can reduce the leakage through the barrier, and typical layers used for this purpose are silicon oxide, silicon nitride, saphire, or other insulators, disposed between the AlGaN and metal gate layers. This type of device is often referred to as a MISHFET and has some advantages over the traditional devices that do not have an insulator layer.

While additional insulator layers can permit thicker strained AlGaN/GaN systems to be constructed, the confinement layer produced by the additional insulator results in lower current carrying capacity due to the scattering effect produced on electrons at the GaN/insulator interface. Also, the additional interface between the AlGaN layer and the insulator results in the production of interface trap states that slow the response of the device. The additional thickness of the oxide, plus the additional interfaces between the two layers, also results in the use of larger gate drive voltages to switch the device.

Conventional device designs using nitride material to obtain nominally off devices rely on this additional insulator to act as a confinement layer, and may reduce or eliminate the top AlGaN layer. These devices, however, typically have lower current carrying capacity due to scattering at the GaN/insulator interface.

Accordingly, it would be desirable to produce a nominally off HEMT switching device or FET that has a low leakage characteristic with fewer interfaces and layers that can still withstand high voltage and produce high current densities with Low resistive losses. Presently, planar devices have been fabricated with GaN and AlGaN alloys through a number of techniques, including MOCVD (metal organic chemical vapor deposition) as well as molecular beam epitaxy (MBE) and hydride vapor phase epitaxy (HVPE).

Materials in the gallium nitride material system may include gallium nitride (GaN) and its alloys such as aluminum gallium nitride (AlGaN), indium gallium nitride (InGaN) and indium aluminum gallium nitride (InAlGaN). These materials are semiconductor compounds that have a relatively wide direct bandgap that permits highly energetic electronic transitions to occur. Gallium nitride materials have been formed on a number of different substrates including silicon carbide (SiC), saphire and silicon. Silicon substrates are readily available and relatively inexpensive, and silicon processing technology has been well developed.

However, forming gallium nitride materials on silicon substrates to produce semiconductor devices presents challenges that arise from differences in the lattice constant, thermal expansion and bandgap between silicon and gallium nitride.

The problems attendant with the lattice mismatch between GaN and traditional substrate materials are also prevalent in material layer structures involving GaN and GaN alloys. For example, GaN and AlGaN materials have lattice structures that differ significantly enough to produce interface strain between the layers, contributing to piezoelectric polarization. In many previous devices, the fields generated by the piezoelectric polarization are controlled to improve the characteristics of the devices. Variations in the content of aluminum in the AlGaN/GaN layer structures tends to vary the lattice mismatch between the materials to achieve different device characteristics, such as improved conductivity or isolation barriers.

One type of device that would benefit it greatly from the realization of a nominally off FET device is a bi-directional switch that can be implemented as a semiconductor device. There is the potential for great improvement in a number of applications through the realization of a bi-directional switch that operates as an enhancement mode device. Presently, bi-directional devices are somewhat complex and typically composed of a number of discrete IC devices. While a nominally on III-nitride bi-directional switch would be advantageous in a number of applications, the nominally off, or enhancement mode device would be preferred for a variety of applications including motor drives and power conversion systems.

SUMMARY OF THE INVENTION

In accordance with the present invention, there is provided a nominally off, or enhancement mode FET device, realized in a III-nitride material system, which can be turned on upon application of a bias to a gate. A FET according to the present invention includes a top III-nitride material formed over a bottom III-nitride material. The two III-nitride materials have different in-plane lattice constants or different bandgaps. A FET according to the present invention is capable of carrying high currents due to the nature of the III nitride material system, where piezoelectric and spontaneous polarization fields contribute to forming a 2DEG that permits high carrier mobility and large current throughput.

According to one aspect of the present invention, the device includes a modification which acts to alter the density of 2DEG such that the device is off when no bias is applied to the gate. The modification is preferably a recess formed under the gate in one of the III-nitride materials (preferably the top III-nitride material), but may be an ion implanted region, a diffused region, an oxidation, or a nitridation. Also, in the preferred embodiment, the modification is formed in the top III-nitride material. However, a device according to the present invention can include a modification in the bottom III-nitride material.

According to one preferred embodiment of the present invention, a nominally off switch is formed with a recessed gate, to permit a 2DEG to form under the gate upon application of a gate potential. The modification alters the density of 2DEG when no potential is applied to the gate whereby it cannot conduct, but upon application of a bias to the gate the 2DEG is restored and is capable of conduction.

In accordance with a preferred embodiment of the present invention, there is provided a FET device and method for operation that is composed of layers of gallium nitride material, such as AlGaN grown on GaN, and includes two source/drain electrodes and a gate electrode.

Advantageously, cladding and contact layers may be grown above or below the active region. Other known processes for constructing electrodes, insulation layers and so forth may also be applied to the present invention.

According to a feature of the present invention, a good GaN insulator interface is provided to improve current carrying capacity, rather than additional insulator layers or structures at the active layer. Without added insulation layers, the epitaxial nature of the hetero-interface described here leads to an order of magnitude higher mobility for the electrons in the 2DEG when accumulated.

According to another embodiment of the present invention, a nominally off bi-directional switch realized in a III-nitride material system provides an AlGaN/GaN interface to provide a location for the formation of a 2DEG. The region surrounding a gate contact in the AlGaN layer is etched back to eliminate the 2DEG locally to obtain an enhancement mode device. According to a feature of the present invention, the gate electrode is equidistant from each of the source electrodes forming the current carrying path for the bi-directional switch.

According to another embodiment of the present invention, there is provided a bi-directional switch with a dual gate, where a gate electrode is paired with a source electrode to obtain a bi-directional switch with multiple gates. According to a feature of the present invention, the AlGaN layer is etched back in a region around the gate electrodes to form an enhancement mode device, where the 2DEG is locally eliminated between the AlGaN/GaN layers.

According to another embodiment of the present invention, a method for constructing an FET in a III-nitride material system provides for overlaying a substrate with a compensated GaN layer, which is overlaid by an AlGaN layer, and subsequently a doped GaN layer. The doped GaN layer may be etched and formed into source/drain electrodes. The AlGaN layer is etched to form an interruption in the 2DEG at the layer interface, resulting in a nominally off switch. A gate electrode may be formed through an insulator layer and metallized with a suitable material, such as TiW, for example. Source/drain contacts also formed through an insulator layer and metallized to provide appropriate contacts.

The large dielectric breakdown field in the III-nitride semiconductor material system permits the construction of nominally off power devices with reduced size standoff regions. The material system also permits the production of devices with reduced specific on resistance in comparison with known devices of similar voltage ratings. In the case of the GaN/AlGaN devices discussed herein, a planar device has approximately a one hundred times improvement in specific on resistance at a voltage rating of approximately 300 volts when compared to a vertical geometry counterpart.

III-nitride HEMT devices can take advantage of symmetrical properties to permit the fabrication of a nominally off bi-directional switch that can block voltage in both directions without sacrificing wafer area. Because of this advantage over traditional switches that block voltage in a single direction, one bi-directional switch can replace four single directional switches and obtain the same overall resistance.

In accordance with the present invention, a dual gated nominally off bi-directional switch design permits a sharing of the voltage standoff region in the device. Where the dual gated design shares the voltage standoff region, the wafer area used to fabricate an enhancement mode bi-directional switch with a dual gate can be significantly reduced.

In another advantage of the present invention, a pair of nominally off bi-directional switches may be realized in a single semiconductor structure to form a bi-directional half bridge circuit with a common drain, for example. Bi-directional half bridge arrangement is useful in a number of applications including motor drive systems, power converters and other well known power control applications. For example, a number of nominally off bi-directional switches may be realized in a single device to create a three-phase bridge circuit, a full-bridge circuit or a half-bridge circuit. In addition, the device according to the present invention may be incorporated into a Schottky bridge.

According to one embodiment of the present invention, a nominally off FET device with a gate, source and drain area are defined using a two layer AlGaN/GaN material to produce a III-nitride HEMT device. The source and drain regions may be formed according to known methods including ion implantation, etching to remove the barrier region over the source and drain regions and application of a low resistance ohmic contact formation process.

The device is also characterized by low leakage in the gate contact and a high breakdown field from the barrier layer. As a result, the device provides a larger dielectric constant compared to conventional insulators such as $SiO_2$ and SiN. The high critical fields of the GaN material allow thin layers to withstand large voltages without dielectric breakdown. The dielectric constant of GaN materials is approximately 10, which is a factor of 2.5 times better than $SiO_2$.

Other features and advantages of the present invention will become apparent from the following description of the invention which refers to the accompanying drawings.

BRIEF DESCRIPTION OF THE DRAWINGS

FIG. 1 is a cross-sectional view of a partially formed III-nitride device.

FIG. 2 shows an etched gate region in the device of FIG. 1.

DETAILED DESCRIPTION OF THE PREFERRED EMBODIMENTS

Figure 3:
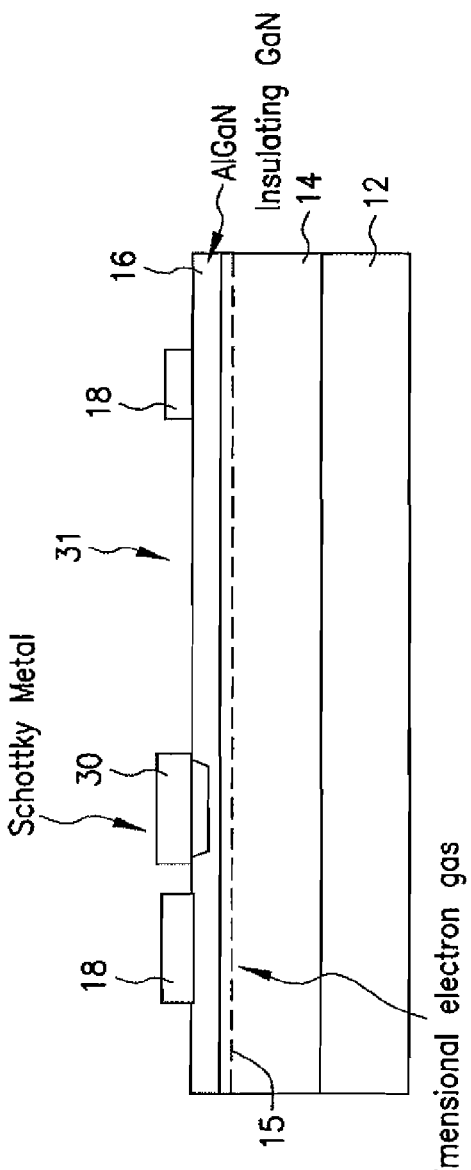
FIG. 3 shows the device of FIG. 2 with a gate contact.

In the construction of GaN material devices, a number of factors come into play to impact the functionality and capability of the devices. A large lattice mismatch in III-nitride materials and the strong piezoelectric and polarization effects in these materials significantly impact the electrical properties of III-nitride heterojunction devices. Nearly all reported GaN-based HEMTs to date use strained GaN—AlGaN junctions with alloy compositions that are designed to relieve the strain to avoid dislocations that may be responsible for long term instabilities in the devices. Various devices and systems for building heterojunction devices have been proposed to control the lattice mismatch and the strain of the GaN—AlGaN junctions. These devices are particularly designed to take advantage of piezoelectric and spontaneous polarization effects and to minimize long term instabilities.

GaN/AlGaN HEMT devices typically have three terminals including a gate, a drain and a source terminal for controlling electrical power flow. An electrical potential applied to the gate terminal controls the flow of current from the drain terminal to the source terminal via an electrically conductive channel. The electrically conductive channel is defined by at least one heterointerface between two different semiconductor materials.

When AlGaN/GaN materials compose the semiconductor materials of a HEMT, and AlGaN is used as a barrier layer, polarization charges resulting from the spontaneous polarization properties of AlGaN as well as strain induced characteristics known as piezoelectric polarization fields are present. The control of the formation of these fields in the construction of an HEMT device leads to different characteristics that make GaN-based HEMT devices suitable for a wide variety of applications depending upon how the device is characterized.

HEMT devices formed with GaN materials typically include a barrier layer of AlGaN that is disposed on the channel layer to induce a 2DEG that produces a high concentration of electrons in the channel to thereby enhance the electrically conductive properties of the channel. Due to the presence of the 2DEG formed at the interface of the AlGaN/GaN layers, fundamentally formed HEMT devices are nominally on because the presence of the channel permits conduction between source and drain electrodes.

Referring now to FIG. 1, a device according to the present invention in the early stages of formation is illustrated as device 10. Device 10 includes a substrate 12, an insulating GaN layer 14 and an active AlGaN layer 16. Ohmic contacts 18 are formed on AlGaN layer 16 to serve as connections for source and/or drain terminals in the resulting HEMT device. GaN/AlGaN interface 15 forms a conductive channel with a 2DEG that permits current flow between Ohmic contacts 18.

GaN layer 14 of device 10 has a larger in-plane lattice constant than AlGaN layers 16. It should be apparent that other III-nitride materials may be used to form device 10, as long as an interface permits a channel to be formed for current conduction. Substrate 12 is an insulating substrate, but can be highly resistive, and is typically formed from well-known materials, such as silicon carbide, silicon, saphire and other well-known substrate materials.

Referring now to FIGS. 2 and 3, a device according to the present invention includes a modification which functions to alter the density of the 2DEG, whereby the device is rendered nominally off, i.e. the 2DEG is interrupted. In the preferred embodiment of the present invention, a recess 20 is etched into AlGaN layer 16. Recess 20 includes sloping side walls 22, but need not be constructed according to any specific geometry. Recess 20 permits a gate contact 30 to be deposited with closer proximity to the interface between AlGaN layer 16 and GaN layer 14. Gate contact 30 is composed of a schottky metal, for example, to act as a control terminal for current in the channel established by the 2DEG. By depositing gate contact 30 into recess 20, the 2DEG underneath the gate contact is eliminated, thereby interrupting the current carrying channel in device 31. In an inactive state, device 31 does not conduct current between ohmic contacts 18, because the current carrying channel established by the 2DEG is interrupted underneath gate contact 30. Device 31 is operable to carry current between ohmic contacts 18 with the application of an electric potential to gate 30 to reestablish the 2DEG and provide a current carrying channel between ohmic contacts 18. In one embodiment, the potential applied to gate contact 30 to cause device 31 to conduct is more positive than a threshold related to the largest potential applied to any of the current carrying electrodes formed by ohmic contacts 18.

Gate contact 30 can be composed of a schottky metal atop AlGaN layer 16 deposited in recess 20. As noted above, AlGaN layer 16 may be replaced by any III-nitride material layer, as long as the in-plane lattice constant of layer 16 is less than the in-plane lattice constant of layer 14.

Device 31 may be constructed with a number of different geometries for ohmic contacts 18 and gate contact 30. For example, gate contact 30 can be a schottky contact encircling one of the ohmic contacts 18. Gate contact 30 may also be formed around a portion of ohmic contact 18, with gaps or etched regions formed to limit current flow in specific directions or to specified regions on device 31. Ohmic contacts 18 and gate contact 30 formed as a schottky contact can also be spaced various distances from each other to increase or decrease breakdown voltage and on-resistance parameters.

Recess 20 under gate contact 30 prevents the formation of a 2DEG under the gate contact, resulting in a clamping of the current under the gate contact. By providing a recessed gate contact on AlGaN layer 16, the current-voltage characteristics of device 31 are modified to obtain a nominally off device rather than a nominally on device. Accordingly, device 31 operates in enhancement mode, rather than depletion mode, and permits the use of device 31 as a high power switch that need not be compensated during start-up to avoid conducting current while control circuitry is powering up. In addition, because device 31 is an enhancement mode device, device 31 can be used to control power delivery on start-up as well. That is, device 31 may be used as a logic power element to control power flow at start-up and during normal operation.

Figure 4:
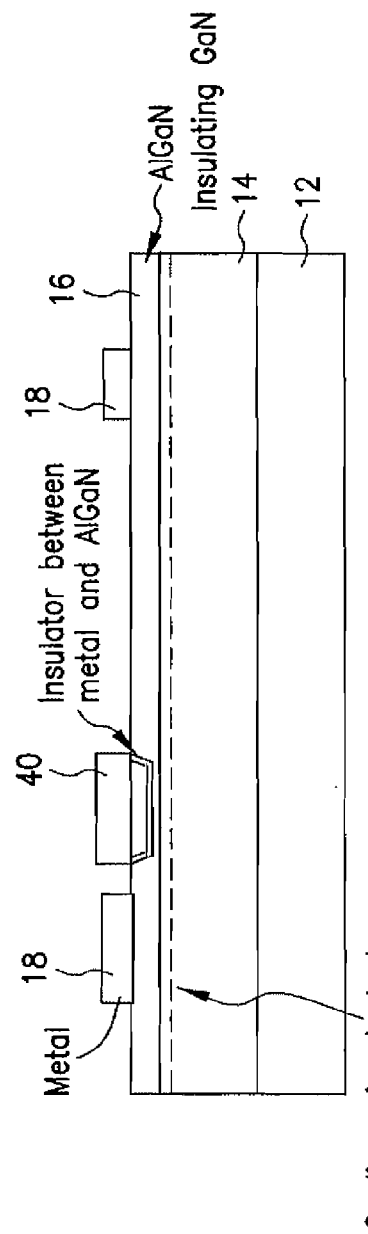
FIG. 4 is a cross-sectional view of a III-nitride device of an insulated gate according to the present invention.

Referring now to FIG. 4, an alternate embodiment of the present invention is illustrated as a device 41. Device 41 is substantially similar to device 31, with the exception that gate contact 40 is formed of a conductive material on an insulator layer 42. Accordingly, gate contact is an insulated contact rather than a schottky contact, and can include a metal conductor of any type to operate the gate. Operation of device 41 is substantially the same as that of device 31, where the 2DEG is interrupted under gate 40 to form a nominally off device. Application of an electric potential to gate contact 40 that is greater than the electrical potential applied to any ohmic contact 18 causes the formation of a 2DEG under gate contact 40, and device 41 can conduct current between ohmic contacts 18. Insulator layer 42 also allows for achieving good confinement and reduced leakage.

Figures 5, 6:
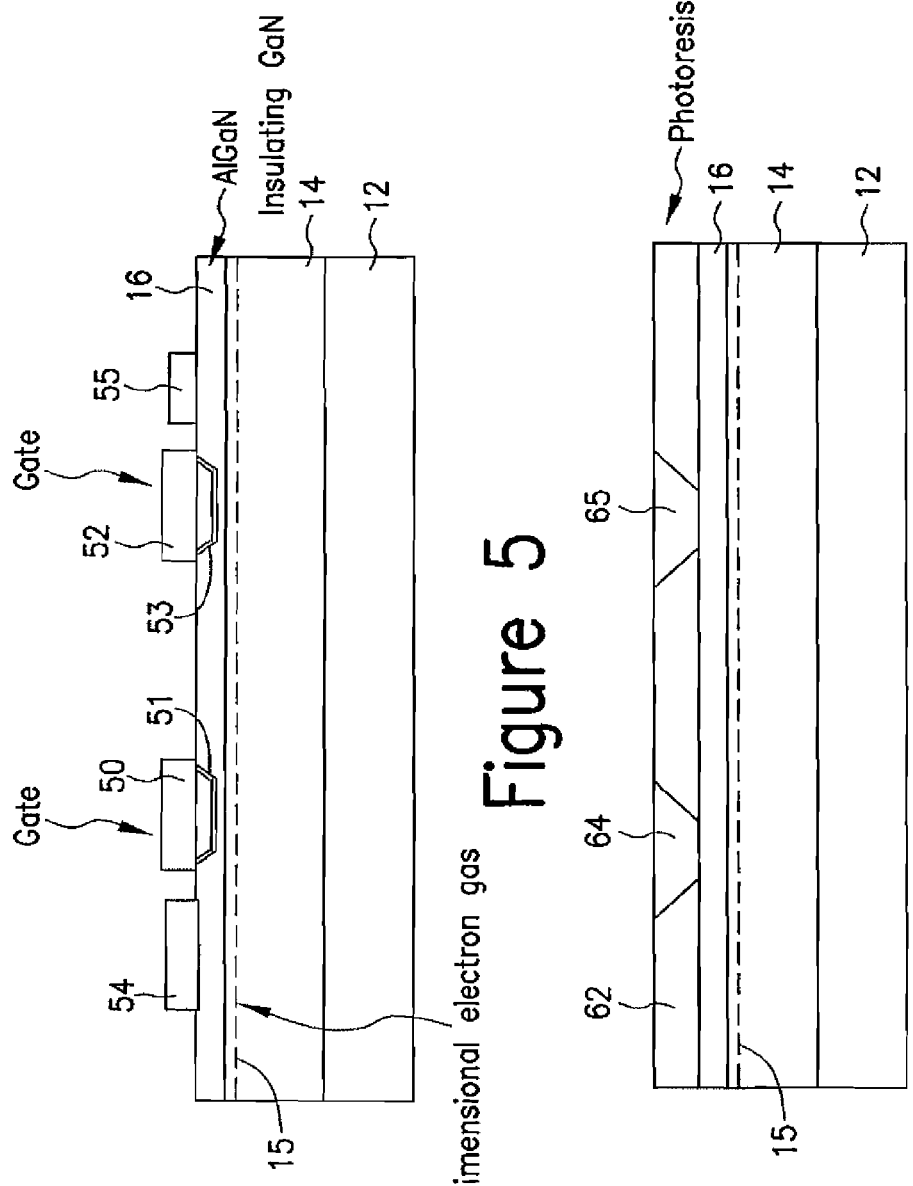
FIG. 5 is a cross-sectional view of dual gated III-nitride device in accordance with the present invention.
FIG. 6 is a cross-sectional view of a partially formed III-nitride device illustrating a process according to the present invention.

Referring now to FIG. 5, another embodiment according to the present invention is illustrated as device 56. Device 56 is a bi-directional field effect transistor with two gate electrodes, 50, 52. As with devices 31 and 41, gates 50 and 52 are formed in a recess in AlGaN layer 16 to provide a nominally off switch. That is, gate electrodes 50, 52 each locally interrupt the 2DEG under the gate contact to interrupt the conduction channel provided at interface 15. Conduction between current carrying electrodes 54, 55 is permitted when both gate contacts 50, 52 are activated. Both gate contacts 50, 52 receive an electric potential that is greater than the electric potential of any current carrying electrode 54, 55 to form a 2DEG under gate electrodes 50, 52 to permit a complete conduction channel to be formed between electrodes 54, 55, for example.

Gate contacts 50, 52 are insulated from AlGaN layer 16 by insulation layers 51, 53, and can be composed of any conductive material. Alternatively, gate contacts 50, 52 may be schottky metal contacts, similar to gate contact 30 of device 31. In that case, gate contacts 50, 52 would directly contact AlGaN layer 16, which can be composed of any III-nitride material with a lower in-plane lattice constant than layer 14.

Bi-directional device 56 provides balanced current conduction between electrodes 54, 55 when the spacing to respective gate contacts 50, 52 is maintained to be equivalent. That is, by forming the spacing between electrode 54 and gate contact 50 to be the same as that between electrode 55 and gate contact 52, breakdown voltage, on-resistance and other switch characteristics can be balanced so that device 56 operates substantially the same whether current is flowing from electrode 54 to electrode 55, or vice-versa. An active gate is meant to indicate that the gate is operated through application of an electric potential above a threshold to cause the switch to change state. An active gate is also meant to indicate that the gate is in a state to permit current conduction in a nominally off device.

Gate contacts 50, 52 are both activated to permit current to flow to/from electrode 54, 55. If one or both of gate contacts 50, 52 are not activated, no current flows between electrodes 54, 55. Accordingly, bi-directional device 56 acts as a logic power AND gate, where the switch is active only when both "inputs" are active, meaning gate contacts 50 and 52 are active. Device 56 can accordingly be used as a power logic device that is especially useful for controlling power during start-up and normal running conditions. In addition, device 56 can be used to detect or respond to fault conditions by sensing and controlling power in response to a fault event.

Referring now to FIG. 6, a technique for fabricating a device 60, which can be processed to form device 56, is illustrated. A photoresist layer 62 is applied over III-nitride barrier layer 16, and openings 64, 65 are formed in photoresist layer 62. Openings 64, 65 have sloped side walls to permit an etching step to transfer the sloped geometry to III-nitride barrier layer 16. Sloped side walls 22 illustrated in FIG. 2 can be formed according to this technique. Typically, III-nitride barrier layer 16 is composed of AlGaN, and a suitable etch process is used with photoresist layer 62 and openings 64, 65 to define recesses in layer 16 with sloped side walls.

The construction of ohmic contacts, schottky contacts, insulator layers and metallized contacts are performed according to known techniques. In addition, passivation layers and cladding may be applied to the enhancement mode transistors described herein, as well as techniques for forming contacts to current carrying electrodes and gates to provide a finished device.

Because device 56 includes two gate contacts 50, 52, the resulting bi-directional switch has a shared drift region that permits a reduced size for device 56. As device 56 becomes smaller in size, a reduced on-resistance can also be realized.

The III-nitride materials used to construct devices 31, 41 and 56 typically exhibit much better blocking characteristics than conventional materials, so that the devices may be constructed in a smaller size than is permitted with conventional materials, while maintaining operational parametric values. Because devices 31, 41 and 56 may be realized in a smaller size than conventional devices to perform comparative functions, a reduced on-resistance can be realized to obtain improved power efficiency.

In addition, electrodes 54, 55 may be formed with a low resistive ohmic contact process that further improves the operational characteristics of device 56.

Although the preferred modification as described herein is a recess formed under the gate in one of the III-nitride materials, a modification in a device according to the present invention may be an ion implanted region, a diffused region, an oxidation, or a nitridation.

Also, in the preferred embodiment, the modification is formed in the top III-nitride material. However, a device according to the present invention can include a modification in the bottom III-nitride material. For example, ions could be implanted in the GaN layer in the locations desired to have an altered 2DEG, and then the AlGaN layer can be grown over the GaN layer.

Figure 7:
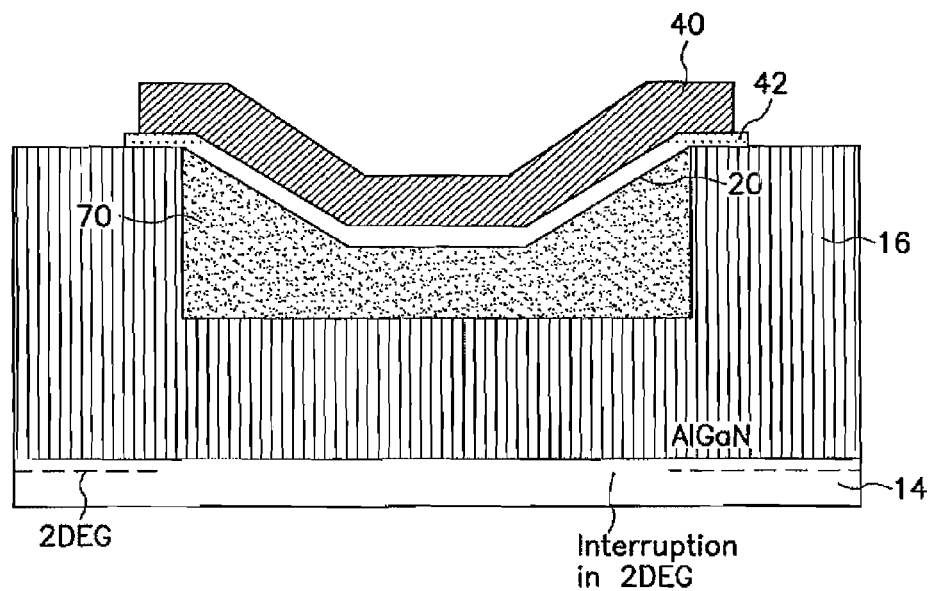
FIGS. 7-11 illustrate variations of a gate structure in a device according to the present invention.

Referring now to FIG. 7, according to one variation, a device according to the present invention may include an implanted region 70. Implanted region 70 includes lattice damage which serves to disrupt the bond structure and the 2DEG thereunder. In the example shown, the implanted region 70 may be formed below recess 20. Recess 20, however, is not necessary.

Figure 8:
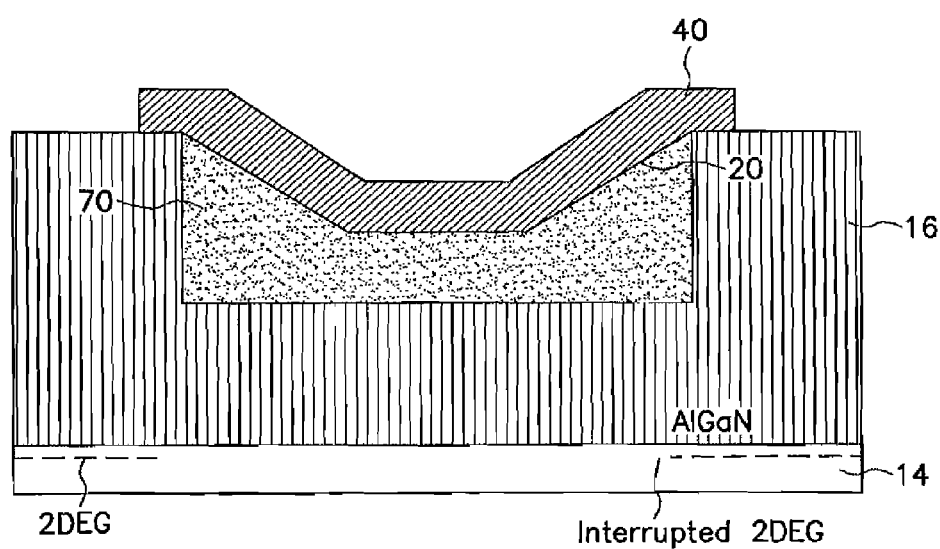

Referring now to FIG. 8, in another variation, gate insulator 42 may be omitted.

Figure 9:
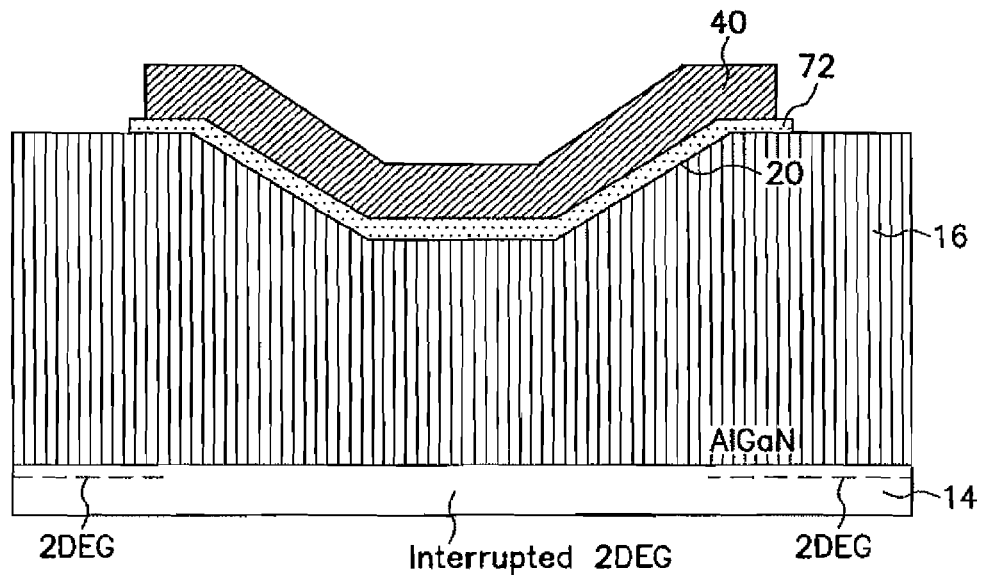

Referring next to FIG. 9, gate insulator 42 may be replaced with a layer of P-type GaN 72. It should be noted that region 70 may be eliminated. It should also be noted that a device according to the variation shown in FIG. 9 does not require recess 20.

Figure 10:
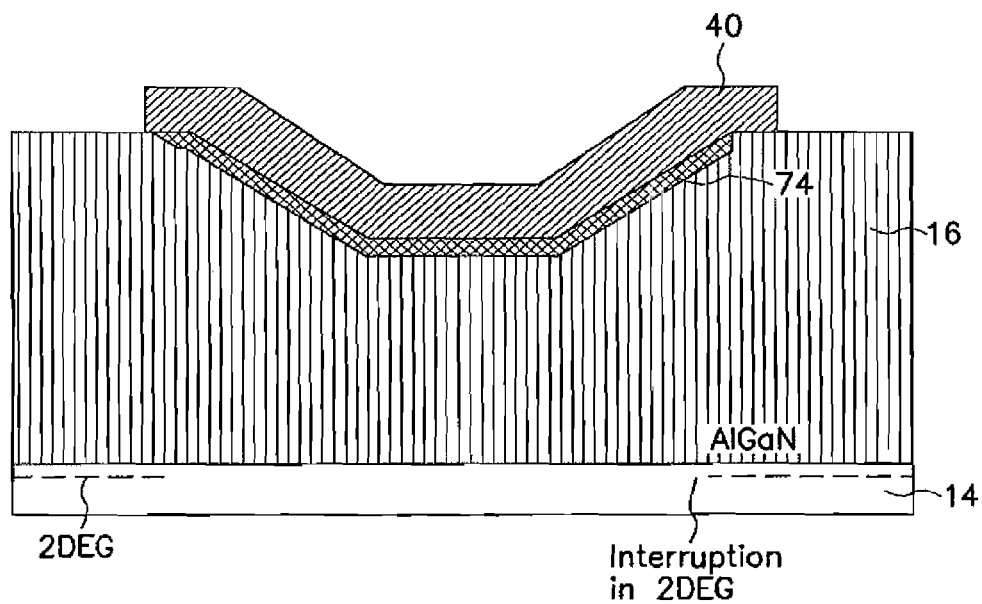

Referring next to FIG. 10, in another variation, the layer of P-type GaN 72 may be removed, and instead a region 74 in AlGaN 16 may be oxidized, nitridized, or diffused with dopants. Again, recess 20 may be omitted from this variation as well.

Figure 11:
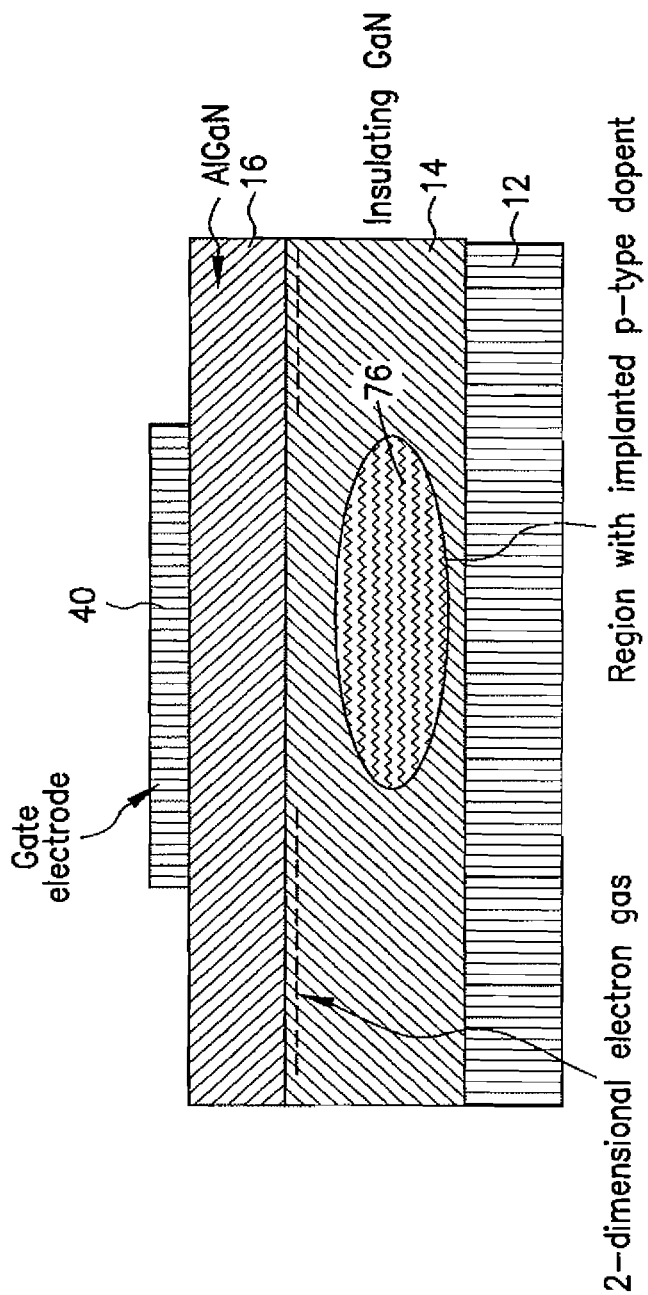

The modification need not be formed in AlGaN 16. Rather, it may be formed within GaN 14. Referring, for example, to FIG. 11, a device according to the present invention may include a P doped region 76 formed in GaN 14 below a gate electrode 40. Region 76 is doped with p type dopants. Standard implantation and annealing steps can be used to form region 76 either through AlGaN 16, or region 76 can be formed in GaN 14, and then covered by another layer of GaN, and then AlGaN. The P type dopants used for forming region 76 may be either Mg, Fe, Cr, Zn. Mg or Zn would be the preferred dopants.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A method of fabricating an enhancement mode III-nitride device, comprising:
    forming a conduction channel at a III-nitride heterojunction between first and second III-nitride bodies, said conduction channel including a two-dimensional electron gas;
    forming a modified region in said first III-nitride body, said modified region causing an interrupted region in said conduction channel, said modified region comprising an oxidized region;
    disposing a gate electrode over said interrupted region, said gate electrode operable to restore said interrupted region of said conduction channel thereby permitting current conduction in said conduction channel.

2. The method of claim 1, wherein said forming said modified region comprises oxidizing said first III-nitride body.

3. The method of claim 1, wherein said gate electrode is Schottky coupled to said second III-nitride body.

4. The method of claim 1, wherein said first III-nitride body is comprised of AlGaN and said second III-nitride body is comprised of GaN.

5. The method of claim 1, wherein forming said conduction channel at said III-nitride heterojunction comprises forming said first III-nitride body on said second III-nitride body, wherein said first and second III-nitride bodies comprise undoped III-nitride bodies.

6. The method of claim 1, wherein said oxidized region is in a top surface of said first III-nitride body.

7. The method of claim 1, wherein said first III-nitride body is an AlGaN layer and said oxidized region is of said AlGaN layer.

8. The method of claim 1, wherein said forming said modified region comprises oxidizing AlGaN.

9. The method of claim 1, wherein said oxidized region is disposed below said gate electrode.

10. The method of claim 1, wherein said gate electrode is directly on said oxidized region.

11. The method of claim 1, wherein said oxidized region is recessed below a top surface of said first III-nitride body.

12. The method of claim 1, wherein said oxidized region is on sidewalls of a recess in said first III-nitride body.

13. The method of claim 1, wherein a portion of said oxidized region tapers into said first III-nitride body.

* * * * *